United States Patent [19]

Yamashita

[11] Patent Number: 5,302,951
[45] Date of Patent: Apr. 12, 1994

[54] WIDE-RANGE LINEAR OUTPUT DIGITAL/ANALOG CONVERTER

[75] Inventor: Masahiro Yamashita, Kasugai, Japan

[73] Assignees: Fujitsu Limited, Kawasaki; Fujitsu VLSI Limited, Kasugai, both of Japan

[21] Appl. No.: 16,196

[22] Filed: Feb. 11, 1993

Related U.S. Application Data

[63] Continuation of Ser. No. 725,700, Jul. 3, 1991, abandoned.

[30] Foreign Application Priority Data

Jul. 3, 1990 [JP]   Japan .................................. 2-175940

[51] Int. Cl.[5] ............................................ H03M 1/66
[52] U.S. Cl. ..................................... 341/144; 341/118
[58] Field of Search ......................... 341/118, 144, 154

[56] References Cited

U.S. PATENT DOCUMENTS

| 4,423,409 | 12/1983 | Naylor et al. | 341/144 |
|---|---|---|---|
| 4,607,249 | 8/1986 | Naylor | 341/144 |
| 4,692,738 | 9/1987 | Suzuki | 341/118 |
| 4,864,304 | 9/1989 | Shigehara et al. | 341/143 |
| 4,891,645 | 1/1990 | Lewis et al. | 341/154 |
| 5,010,337 | 4/1991 | Hisano et al. | 341/154 |

Primary Examiner—Marc S. Hoff
Attorney, Agent, or Firm—Armstrong, Westerman, Hattori, McLeland & Naughton

[57] ABSTRACT

In an digital/analog converter having a conversion circuit for converting a digital signal into an analog signal, and an output voltage follower connected to the conversion circuit, a voltage amplitude lowering circuit for lowering an amplitude of power supply voltages applied to the conversion circuit to conform to an amplitude of a linear output of the voltage follower, and a voltage amplitude enlarging circuit for enlarging the amplitude of the output of the voltage follower.

13 Claims, 9 Drawing Sheets

WIDE-RANGE LINEAR OUTPUT DIGITAL/ANALOG CONVERTER

This application is a continuation of application Ser. No. 07/725,700 filed Jul. 3, 1991, now abandoned.

BACKGROUND OF THE INVENTION

1) Field of the Invention

The present invention relates to a digital/analog (D/A) converter having a D/A portion and an output voltage follower.

2) Description of the Related Art

Recently, as the size of electronic apparatuses has been reduced, D/A converters have been used as semi-fixed resistors for digital tuning, and wide-range output characteristics are required for such D/A converters.

A prior art D/A converter includes a digital/analog conversion circuit and an output voltage follower.

In the above-mentioned prior art, however, since the output voltage follower has a smaller range linear output characteristic than a range defined by two power supply voltages, the linear output characteristic of the entire D/A converter is small. This will be later explained in more detail.

SUMMARY OF THE INVENTION

Therefore, an object of the present invention is to provide a D/A converter having a wide-range linear output characteristic.

According to the present invention, in a D/A converter having a conversion circuit for converting a digital signal into an analog signal, and an output voltage follower connected to the conversion circuit, a voltage amplitude reducing circuit for reducing an amplitude of power supply voltages applied to the conversion circuit to conform to an amplitude of a linear output of the voltage follower, and a voltage amplitude enlarging circuit for enlarging the amplitude of the output of the voltage follower. The amplitude of the output of the conversion circuit is thus made the same as the amplitude of the linear range output of the voltage follower. Also, the linear range of the output of the entire D/A converter is the same as the amplitude of the two power supply voltages.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of embodiments of the present invention, a prior art D/A converter is described with reference to FIGS. 1 through 6.

Figure 1:
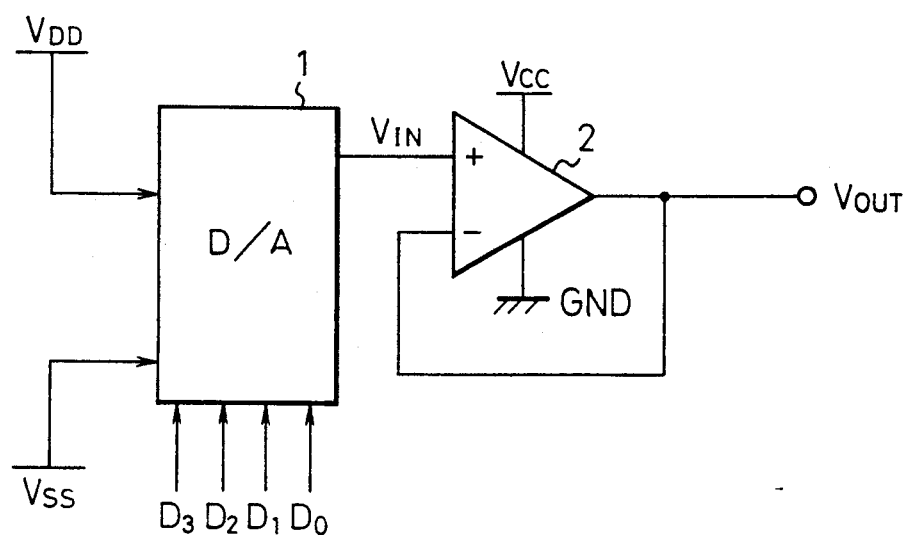
FIG. 1 is a circuit diagram illustrating a prior art D/A converter.

In FIG. 1, which illustrates a prior art D/A converter, reference numeral 1 designates a D/A conversion circuit 1 which receives four bit digital signals $D_0$, $D_1$, $D_2$, and $D_3$ to generate an analog signal $V_{IN}$. The analog signal $V_{IN}$ is transmitted to a voltage follower 2 formed by an operational amplifier having an output connected to an inverting input.

Two power supply voltages $V_{SS}$ and $V_{DD}$ are applied to the D/A conversion circuit 1, and accordingly, the analog voltage of the analog signal $V_{IN}$ has a minimum voltage $V_{SS}$ and a maximum voltage $V_{DD}$. Also, the analog voltage of the analog signal $V_{IN}$ is proportional to the digital value represented by $D_0$, $D_1$, $D_2$, and $D_3$ between $V_{SS}$ and $V_{DD}$.

The voltage follower 2 isolates the analog signal $V_{IN}$ of the D/A conversion circuit 1 from the output voltage $V_{IN}$ of the voltage follower 2. Namely, if a load such as a current flow-in type or a current flow-out type is connected directly to the output of the D/A conversion circuit 1, the analog signal $V_{IN}$ per se may be changed in accordance with a current flowing through the load. Conversely, in FIG. 1, since the voltage follower 2 (operational amplifier) has a high input impedance and a low output impedance, the analog voltage $V_{IN}$ is not affected by the current flowing through the load.

Figure 2:
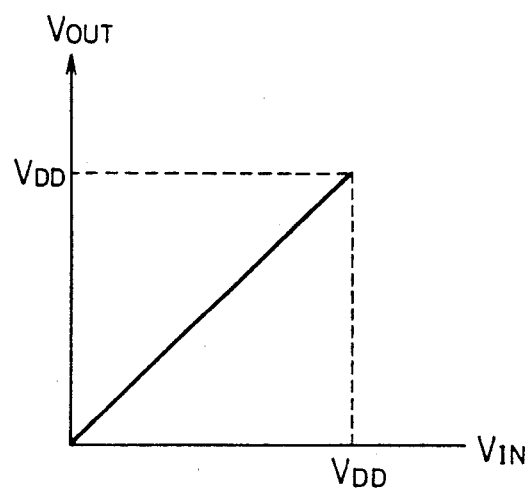
FIG. 2 is a graph showing an ideal output characteristic of the D/A converter of FIG. 1.

In FIG. 2, which shows an ideal output characteristic of the output voltage $V_{OUT}$ of FIG. 1, the analog voltage of the analog signal $V_{IN}$ is changed from $V_{SS}$ to $V_{DD}$, and the output voltage $V_{OUT}$ is also changed from $V_{SS}$ to $V_{DD}$. An actual output characteristic of the output voltage $V_{OUT}$, however, is not fully linear, as explained below.

Figure 3:
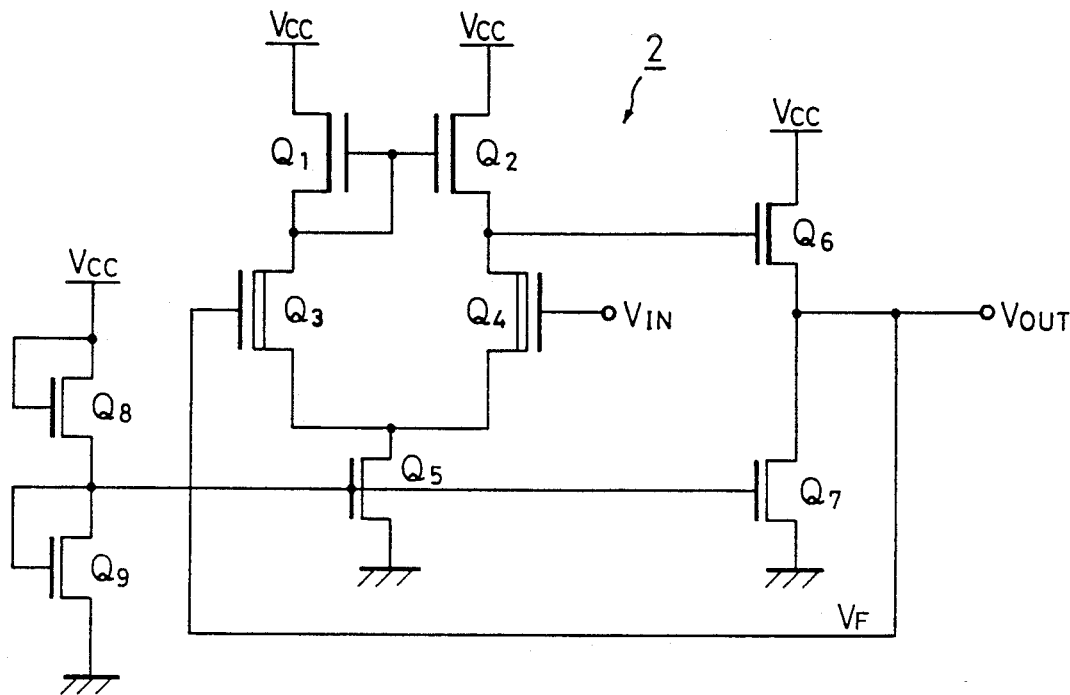
FIG. 3 is a circuit diagram of an example of output voltage follower of FIG. 1.

In FIG. 3, which illustrates an example of the voltage follower 2 of FIG. 1, a CMOS (broadly, CMIS) configuration is adopted. That is, references $Q_1$ and $Q_2$ designate P-channel enhancement type transistors connected to a power supply $V_{CC}$ having a voltage of, for example, 5 V. Also, references $Q_3$ and $Q_4$ designate N-channel depletion type transistors forming a differential stage. An N-channel enhancement type transistor $Q_5$ is connected between the common source of the transistors $Q_3$ and $Q_4$ and a power supply GND having a voltage of, for example, 0V. A gate of the transistor $Q_5$ is connected to a series of two N-channel enhancement type drain-gate connected transistors $Q_8$ and $Q_9$ which serve as a constant voltage circuit. Therefore, the transistor $Q_5$, and the constant voltage circuit ($Q_8$, $Q_9$) form a constant current circuit.

The analog signal $V_{IN}$ of the D/A conversion circuit 2 is supplied to a gate of the transistor $Q_4$, and the output $V_{OUT}$ of the voltage follower 2, i.e., an output voltage of an output stage thereof is applied to a gate of the transistor $Q_3$. Note that this output stage is formed by a series of a P-channel enhancement-type transistor $Q_6$ and an N-channel enhancement-type transistor $Q_7$. In this case, the transistor $Q_7$ and the transistors $Q_8$ and $Q_9$ form a constant current circuit.

In FIG. 3, when the analog voltage of the analog signal $V_{IN}$ of the D/A conversion circuit 1 is made higher than the output voltage $V_{OUT}$, which in this case is called a feedback voltage $V_F$, the drain voltage of the transistor $Q_4$ is lowered to reduce the source-drain voltage of the transistor $Q_6$. As a result, the output voltage $V_{OUT}$ (the feedback voltage $V_F$) is increased. Thus, the output voltage $V_{OUT}$ is made the same as the analog voltage of the analog signal $V_{IN}$ by the feedback voltage $V_F$.

Figure 4:
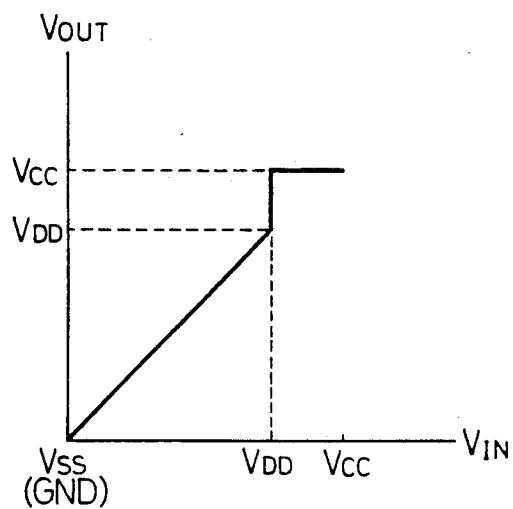
FIG. 4 is a graph showing an output characteristic of the output voltage follower of FIG. 3.

In FIG. 3, the analog voltage of the analog signal $V_{IN}$ is changed from 0V (in this case, $V_{SS} = GND = 0V$) to $V_{DD}$. When the analog voltage of the analog signal $V_{IN}$ approaches the power supply voltage $V_{CC}$, the difference in potential between the source and drain of the transistor $Q_4$ approaches zero. As a result, the characteristic of the output voltage $V_{OUT}$ with respect to the analog signal $V_{IN}$ is not linear in the proximity of $V_{IN} \cong V_{CC}$, as shown in FIG. 4. Accordingly, to obtain a complete linear characteristic of the output voltage $V_{OUT}$, the power supply voltage $V_{DD}$ is made lower than the power supply voltage $V_{CC}$, which requires three power supplies $V_{SS}(=GND)$, $V_{DD}$, and $V_{CC}$.

Figure 5:
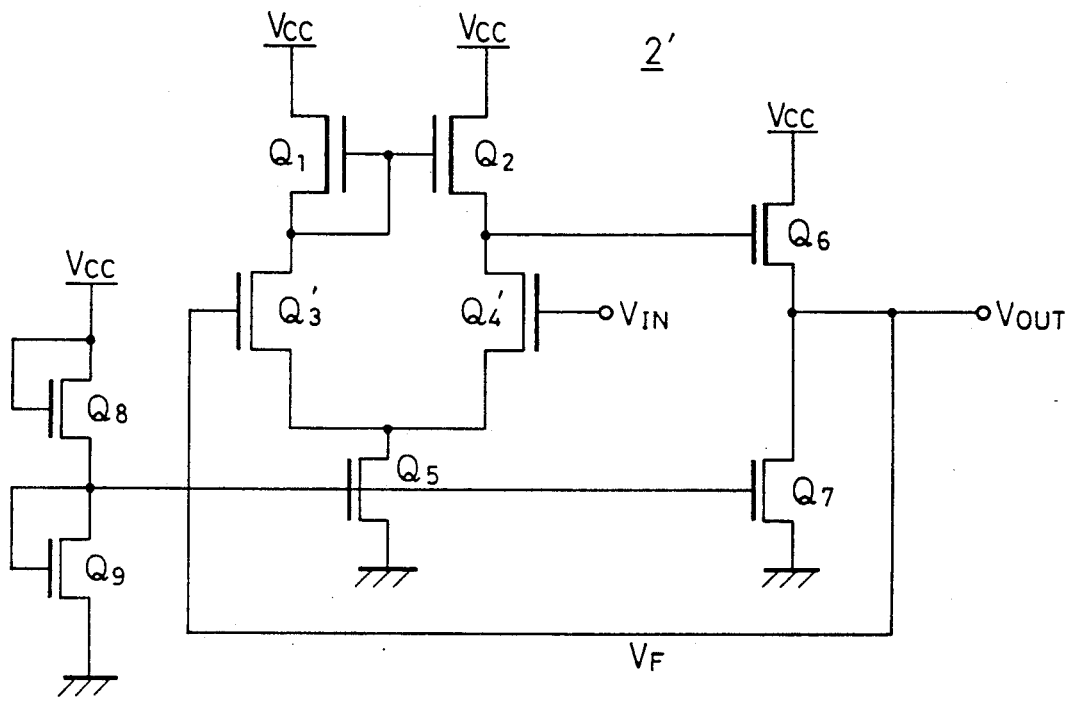
FIG. 5 is a circuit diagram of another example of the output voltage follower of FIG. 1.

In FIG. 5, which illustrates another example of the voltage follower of FIG. 1, this voltage follower is denoted by 2'. In the voltage follower 2', N-channel enhancement-type transistors $Q_3'$ and $Q_4'$ are used instead of the N-channel depletion-type transistors $Q_3$ and $Q_4$ of FIG. 3.

Also, in FIG. 5, when the analog voltage of the analog signal $V_{IN}$ of the D/A conversion circuit 1 is made higher than the output voltage $V_{out}$ (the feedback voltage $V_F$), the drain voltage of the transistor $Q_4'$ is lowered to reduce the source-drain voltage of the transistor $Q_6$. As a result, the output voltage $V_{OUT}$ (the feedback voltage $V_F$) is increased. Thus, the output voltage $V_{OUT}$ is made the same as the analog voltage of the analog signal $V_{in}$ by the feedback voltage $V_F$.

Figure 6:
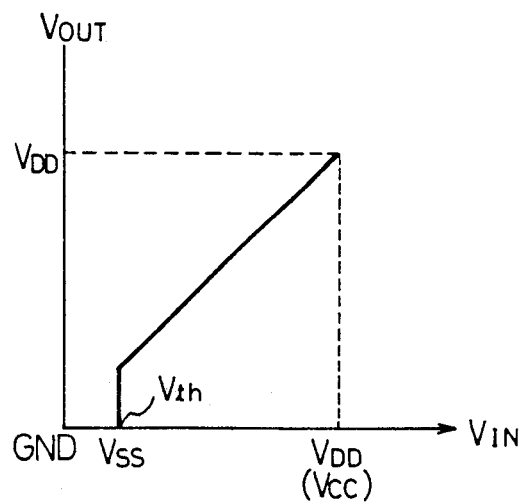
FIG. 6 is a graph showing an output characteristic of the output voltage follower of FIG. 5.

In FIG. 3, however, when the analog voltage of the analog signal $V_{IN}$ becomes lower than a threshold voltage Vth of the transistor $Q_4'$, the transistor $Q_4'$ is turned OFF. As a result, the characteristic of the output voltage $V_{OUT}$ with respect to the analog signal $V_{IN}$ is not linear in the proximity of $V_{IN} \cong V_{SS}(=0V)$, as shown in FIG. 6. Accordingly, to obtain a complete linear characteristic of the output voltage $V_{OUT}$, the power supply voltage $V_{SS}$ is made higher than the threshold voltage Vth, which requires three power supplies GND, $V_{SS}$, and VDD ($V_{CC}$).

Figure 7:
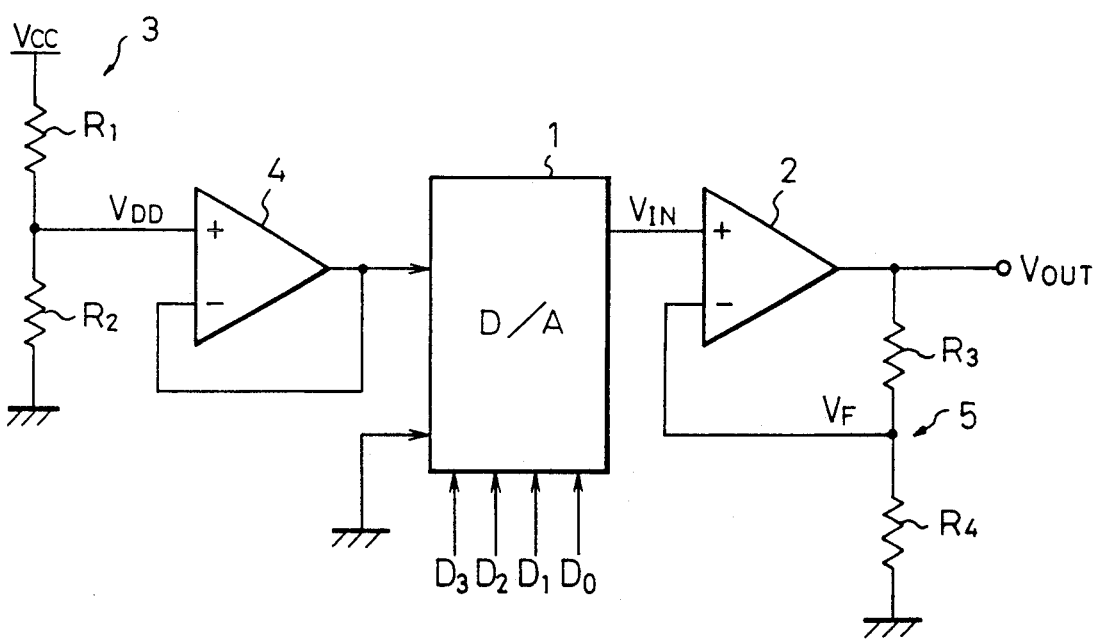
FIG. 7 is a circuit diagram illustrating a first embodiment of the D/A converter according to the present invention.
Figure 8:
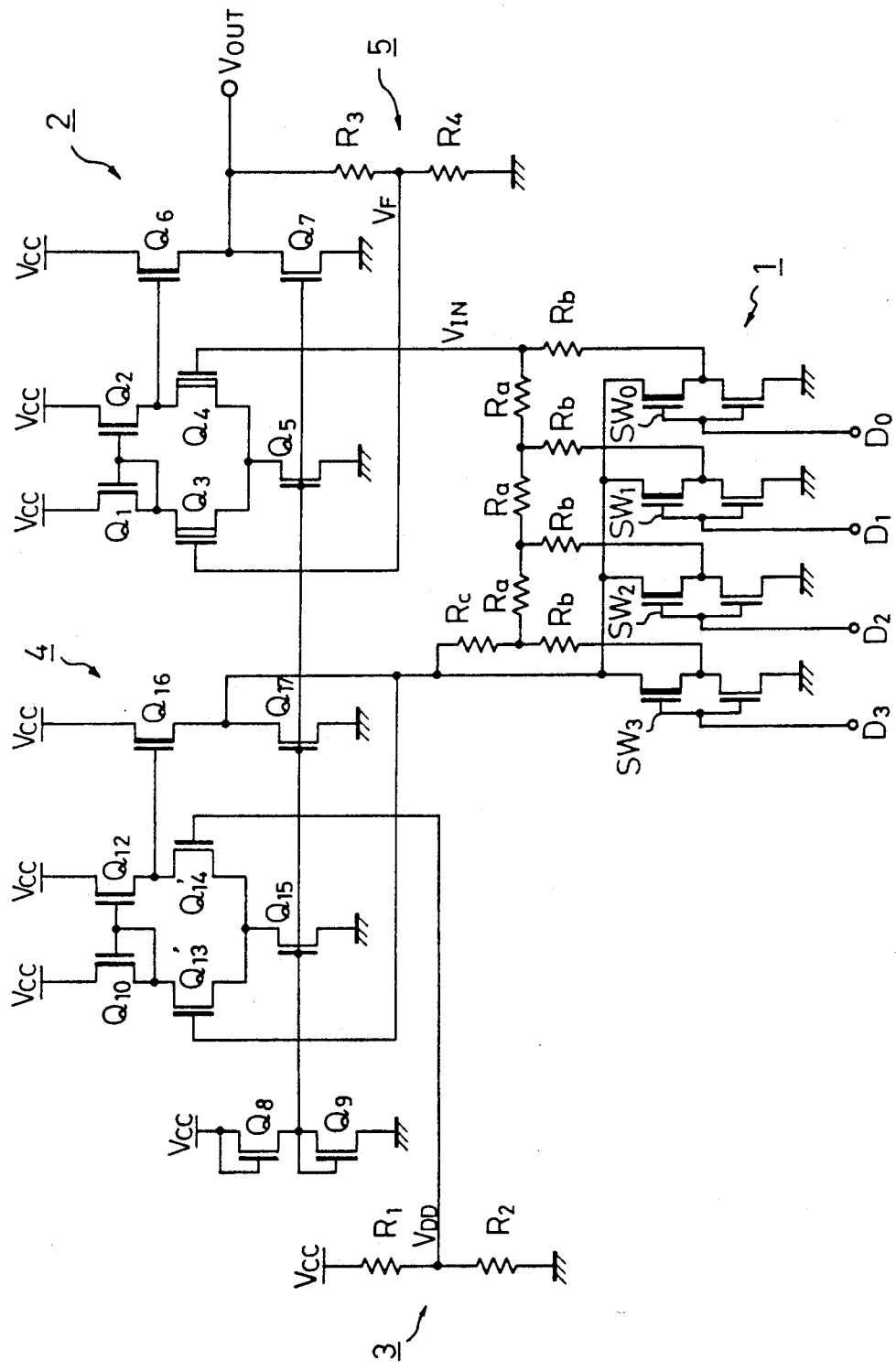
FIG. 8 is a detailed circuit diagram of the D/A converter of FIG. 7.

FIG. 7 illustrates a first embodiment of the present invention, and FIG. 8 is a detailed circuit diagram of the D/A converter 7. In FIGS. 7 and 8, a voltage amplitude reducing circuit 3 formed by a series of two resistors $R_1$ and $R_2$ between GND and $V_{CC}$, a voltage follower 4, and an voltage amplitude enlarging circuit 5 are added to the circuit of FIG. 1. Also, the amplifier circuit 2 is the same as the voltage follower 2 of FIG. 3. Note that the voltage follower 2' of FIG. 5 is preferably used for the voltage follower 4.

In FIG. 7, only two power supplies GND and $V_{CC}$ are used.

The voltage amplitude reducing circuit 3 generates a divided voltage $V_{DD}$ as follows:

$$V_{DD} = V_{CC} \cdot R_2/(R_1 + R_2)$$

For example, if $R_1/R_2 = 10K\Omega/40K\Omega = \frac{1}{4}$, $$V_{DD} = V_{CC} \cdot 4/5$$

Then, the reduction ratio $\gamma$ is $\gamma = 4/5$.

The voltage follower 4, is for example, the same as the voltage follower 2' of FIG. 5. That is, as illustrated in FIG. 8, the voltage follower 4 includes P-channel enhancement-type transistors $Q_{10}$ and $Q_{12}$, N-channel enhancement type transistors $Q_{13}'$ and $Q_{14}'$ which serve as a differential stage, and an N-channel enhancement-type transistor $Q_{15}$ which forms a constant current circuit with the transistors $Q_8$ and $Q_9$. The voltage follower 4 includes an output stage formed by a P-channel enhancement-type transistor $Q_{16}$ and an N-channel depletion-type transistor $Q_{17}$ which forms a constant current circuit with the transistors $Q_8$ and $Q_9$. The output voltage of the differential stage, i.e., the drain voltage of the transistor $Q_{12}$ is applied to the gate of the transistor $Q_{16}$ of the output stage.

The divided voltage $V_{DD}$ of the voltage amplitude reducing circuit 3 is applied to the gate of the transistor $Q_{14}'$ of the differential stage, and the output voltage of the output stage, i.e., the drain voltage of the transistor $Q_{16}$ is fed back to the gate of the transistor $Q_{13}'$ of the differential stage.

Since the voltage $V_{DD}$ of the voltage amplitude reducing circuit 3 is, in this case, larger than the threshold voltage $V_{th}$ of the transistor $Q_{14}$, the voltage follower 4 always generates and transmits the voltage $V_{DD}$ to the D/A conversion circuit 1.

As illustrated in FIG. 8, the D/A conversion circuit 1 includes a R-2R ladder resistor circuit formed by resistors $R_a$, $R_b$, and $R_c$, and a CMOS switches $SW_0$, $SW_1$, $SW_2$, and $SW_3$ switched by four bit data $D_0$ to $D_3$. In the R-2R ladder resistor circuit, the resistor $R_c$ is a level control resistor for receiving the voltage $V_{DD}$ of the voltage follower 4. Also, the values of the resistors $R_a$, $R_b$, and $R_c$ satisfy the following condition:

$$R_b = R_c = 2R_a$$

Thus, since the D/A conversion circuit 1 receives power supply voltages GND (0V) and $V_{DD}$, the D/A conversion circuit 1 generates an analog voltage from 0V to $4V_{CC}/5$. This analog voltage is applied as the analog signal $V_{IN}$ to the amplifier circuit (operational amplifier) 2 (which is the same as the voltage follower 2 of FIG. 3). Connected to the amplifier circuit 2 is the voltage amplitude enlarging circuit 5 formed by a series of two resistors $R_3$ and $R_4$ between the output $V_{OUT}$ of the amplifier circuit 2 and the ground (GND). In this case, the values, of the resistors $R_3$ and $R_4$ satisfy the following condition:

$$R_3/R_4 = 10K\Omega/40K\Omega = \frac{1}{4}$$

Therefore, the feedback voltage $V_F$ is $$V_F = V_{OUT} \cdot R_4/(R_3 + R_4)$$
$$= V_{OUT} \cdot 4/5$$

Since the feedback voltage $V_F$, which is smaller than the output voltage $V_{OUT}$, is input to the amplifier circuit (operational amplifier) 2, the amplifier circuit 2 is operated so that the feedback voltage $V_F$ coincides with the analog voltage of the analog signal $V_{IN}$ of the D/A conversion circuit 1. As a result, $$V_{IN} = V_F = V_{OUT} \cdot R_4/(R_3 + R_4)$$
$$\therefore V_{OUT} = V_{IN} \cdot (R_3 + R_4)/R_4$$
$$= V_{IN} \cdot 5/4$$

That is, the amplification factor (enlarging ratio) $\beta$ of the amplifier circuit 2 is 5/4 which is a reverse number of the reducing ratio $\gamma$ of the voltage amplitude reducing circuit 3.

In FIG. 7 and 8, the reducing ratio $\gamma$ of the voltage amplitude reducing circuit 3 is determined so that the voltage $V_{DD}$ is within a linear output range of the voltage follower (operational amplifier) 4, i.e., the voltage $V_{DD}$ is larger than $V_{th}$ in FIG. 6, and the enlarging ratio $\beta$ of the voltage amplitude enlarging circuit 5 is determined such that the feedback voltage $V_F$ is within a linear output range of the amplifier circuit (operational amplifier) 2, i.e., $V_F$ is smaller than $V_{DD}$ in FIG. 4. Thus, the characteristic of the output voltage $V_{OUT}$ to the input voltage $V_{IN}$ is substantially the same as shown in FIG. 2, thereby obtaining an accurate D/A conversion.

Also, the enlarging ratio $\beta$ is a reverse number of the reducing ratio $\gamma$ to compensate for a reduction of the analog signal $V_{IN}$. This is also helpful in a high power control of the D/A converter, in addition to an accurate control thereof. Note that the enlarging ratio $\beta$ can be larger than the reverse number of the reducing ratio $\gamma$.

Figure 9:
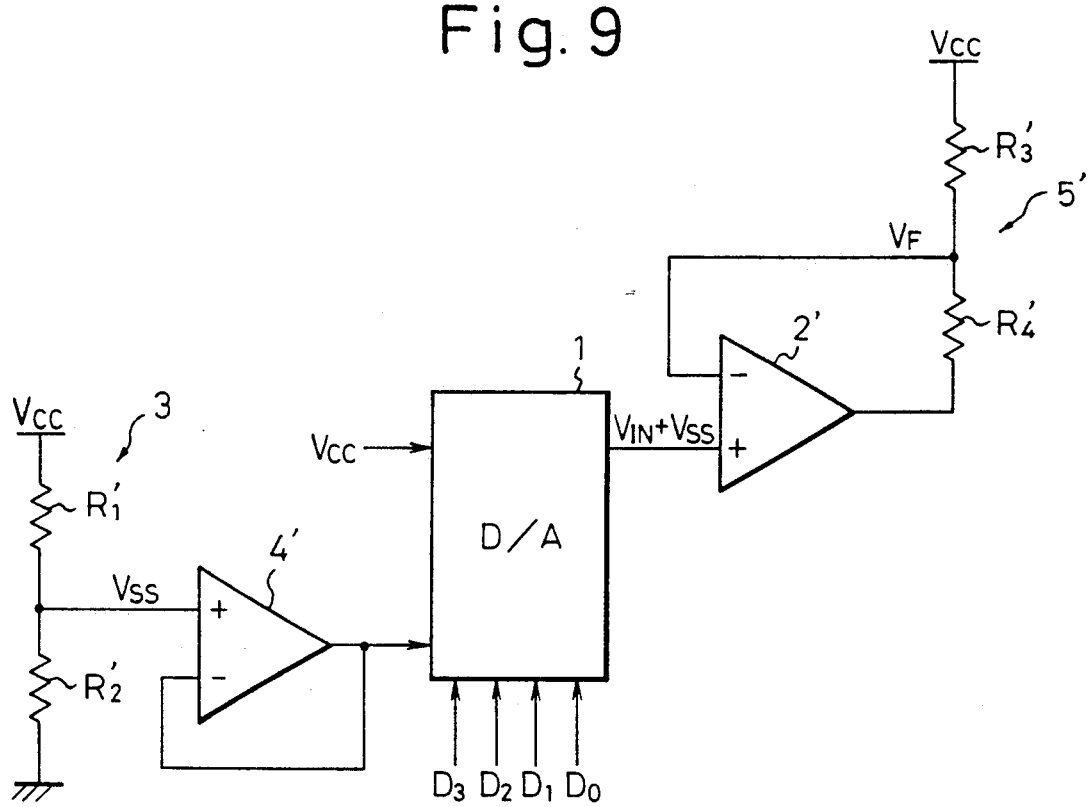
FIG. 9 is a circuit diagram illustrating a second embodiment of the D/A converter according to the present invention.
Figure 10:
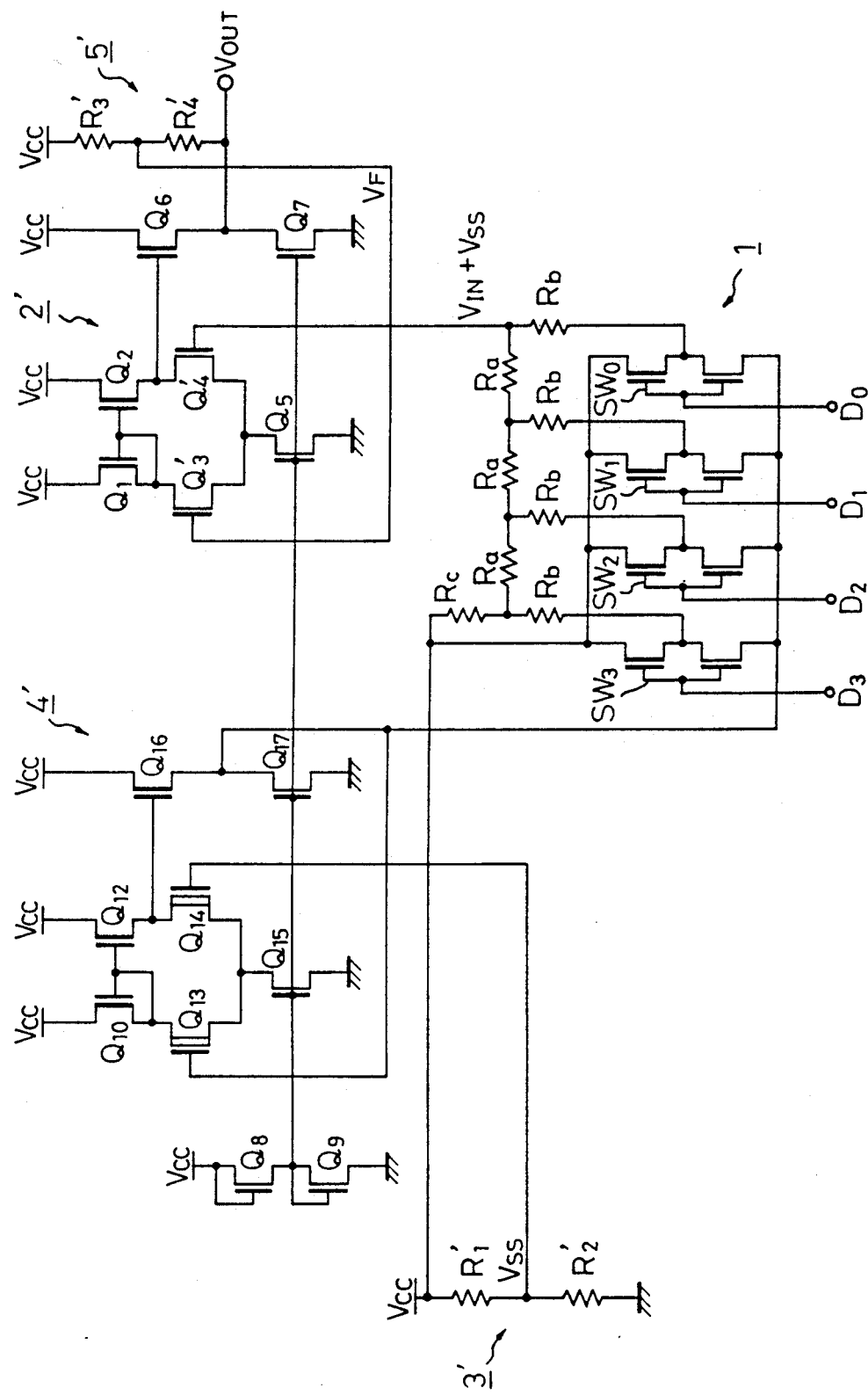
FIG. 10 is a detailed circuit diagram of the D/A converter of FIG. 9.

FIG. 9 illustrates a second embodiment of the present invention, and FIG. 10 is a detailed circuit diagram of the D/A converter 9. In FIGS. 9 and 10, a voltage amplitude reducing circuit 3' formed by a series of two resistors $R_1'$ and $R_2'$ between GND and $V_{CC}$, a voltage follower 4', and an voltage amplitude enlarging circuit 5' are added to the circuit of FIG. 1. Also, the amplifier circuit 2' is the same as the voltage follower 2' of FIG. 5. Note that the voltage follower 2 of FIG. 5 is preferably used for the voltage follower 4'.

Also, in FIG. 9, only two power supplies GND and $V_{CC}$ are used.

The voltage amplitude reducing circuit 3' generates a divided voltage $V_{CC}$ as follows:

$$V_{SS} = V_{CC} \cdot R_2'/(R_1' + R_2')$$

For example, if $R_1'/R_2' = 40K\Omega/10K\Omega = 4$, $$V_{SS} = V_{CC} \cdot 1/5$$

Then, the reduction ratio $\gamma$ is also $\gamma = 4/5$.

The voltage follower 4' is, for example, the same as the voltage follower 2 of FIG. 3. That is, as illustrated in FIG. 10, the voltage follower 4' includes N-channel depletion-type transistors $Q_{13}$ and $Q_{14}$ instead of the N-channel depletion-type transistors $Q_{13}'$ and $Q_{14}'$ instead of the N-channel enhancement-type transistors $Q_{13}'$ and $Q_{14}'$ of FIG. 8.

The divided voltage $V_{SS}$ of the voltage amplitude reducing circuit 3' is applied to the gate of the transistor $Q_{14}$ of the differential stage, and the output voltage of the output stage, i.e., the drain voltage of the transistor $Q_{16}$ is fed back to the gate of the transistor $Q_{13}$ of the differential stage.

Since the voltage $V_{SS}$ of the voltage amplitude reducing circuit 3' is, in this case, larger than $V_{DD}$ in FIG. 4, the voltage follower 4' always generates and transmits the voltage $V_{SS}$ to the D/A conversion circuit 1.

Thus, since the D/A conversion circuit 1 receives power supply voltages $V_{SS}$ and $V_{CC}$, the D/A conversion circuit 1 generates an analog voltage from $V_{SS}$ to $V_{CC}$. This analog voltage is applied as the analog signal $V_{IN} + V_{SS}$ to the amplifier circuit (operational amplifier) 2' (which is the same as the voltage follower 2' of FIG. 5). Connected to the amplifier circuit 2' is the voltage amplitude enlarging circuit 5' formed by a series of two resistors $R_3'$ and $R_4'$ between the output $V_{OUT}$ of the amplifier circuit 2 and the power supply $V_{CC}$. In this case, the values of the resistors $R_3'$ and $R_4'$ satisfy the following condition:

$$R_3'/R_4' = 40K\Omega/10K\Omega = 4$$

Therefore, the feedback voltage $V_F$ is $$V_F = \frac{V_{CC} \cdot R_4' + V_{OUT} \cdot R_3'}{R_4' + R_3'}$$
$$= \frac{V_{CC} + 4 V_{OUT}}{5}$$
$$= V_{CC}/5 + V_{OUT} \cdot 4/5$$

Since the analog voltage $V_{IN} + V_{SS}$, which is larger than the threshold voltage $V_{th}$ of the transistor $Q_4'$, is input to the amplifier circuit (operational amplifier) 2', the amplifier circuit 2' is operated such that the feedback voltage $V_F$ coincides with the analog voltage of the analog signal $V_{IN} + V_{SS}$ of the D/A conversion circuit 1. As a result, $$V_{IN} + V_{SS} = V_{CC}/5 + V_{OUT} \cdot 4/5$$

In this case, $V_{SS} = V_{CC}/5$.
Therefore, $$V_{OUT} = V_{IN} \cdot 5/4$$
$$\therefore V_{OUT} = V_{IN} \cdot (R_3 + R_4)/R_4$$
$$= V_{IN} \cdot 5/4$$

That is, the amplification factor (enlarging ratio) $\beta$ of the amplifier circuit 2' is 5/4 which is a reverse number of the reducing ratio $\gamma$ of the voltage amplitude reducing circuit 3'.

In FIG. 9 and 10, the reducing ratio $\gamma$ of the voltage amplitude reducing circuit 3' is determined such that the voltage $V_{SS}$ is within a linear output range of the voltage follower (operational amplifier) 4', i.e., the voltage $V_{SS}$ is larger than $V_{DD}$ in FIG. 4, and the enlarging ratio $\beta$ of the voltage amplitude enlarging circuit 5' is determined such that the feedback voltage $V_F$ is within a linear output range of the amplifier circuit (operational amplifier) 2', i.e., $V_F$ is larger than the threshold voltage $V_{th}$ in FIG. 6. Thus, the characteristic of the output voltage $V_{OUT}$ to the input voltage $V_{IN}$ is substantially the same as shown in FIG. 2, thereby obtaining an accurate D/A conversion.

Also, in FIGS. 9 and 10, the enlarging ratio $\beta$ is a reverse number of the reducing ratio $\gamma$ to compensate for a reduction of the analog signal $V_{IN}$. This is also helpful in a high power control of the D/A converter, in addition to an accurate control thereof. Note that the enlarging ratio $\beta$ can be larger than the reverse number of the reducing ratio $\gamma$.

Also, the above-mentioned entire D/A converter as illustrated in FIGS. 7 and 8, and in FIGS. 9 and 10 can be formed on a single semiconductor chip.

Further, the voltage follower 4 (4') of FIGS. 7 and 8 (9 an 10) can be deleted, if the values of the resistors $R_1$ and $R_2$ ($R_1'$ and $R_2'$) are adjusted in consideration of the values of the resistors $R_a$, $R_b$, and $R_c$ of the D/A conversion circuit 1.

In addition, any type of D/A conversion circuits other than the R−2R ladder resistor circuit can be adopted.

Figure 11:
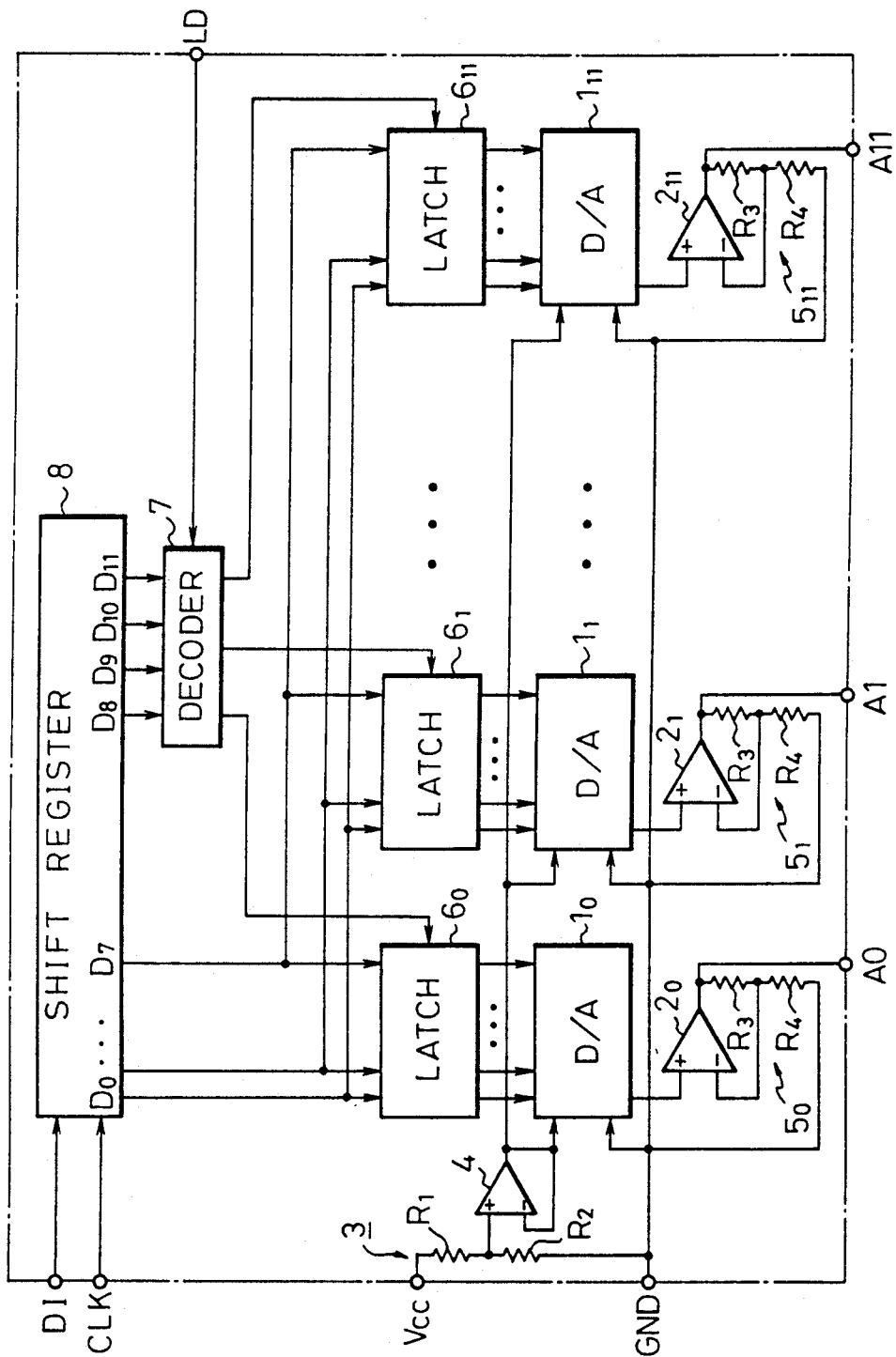
FIG. 11 is a block circuit diagram illustrating a semi-fixed resistor circuit to which the D/A converter of FIG. 7 is applied.

In FIG. 11, the D/A converter of FIGS. 7 and 8 is applied to a semi-fixed resistor circuit which has twelve 8-bit D/A converters. That is, in FIG. 11, twelve D/A conversion circuits $1_0$, $1_1$, ..., and $1_{11}$, which have the same configuration as the D/a conversion circuit 1 of FIG. 8, twelve amplifier circuits (operational amplifier) $2_0$, $2_1$, ..., $2_{11}$, which have the same configuration as the amplifier circuit 2 of FIG. 8, and twelve enlarging circuits $5_0$, $5_1$, ..., $5_{11}$, which have the same configuration as the voltage amplitude enlarging circuit 5 of FIGS. 7 and 8. Note only one voltage amplitude reducing circuit 3 and only one voltage follower 4 are provided. Also, latch circuits $6_0$, $6_1$, ..., $6_{11}$ are provided for supplying 8-bit digital data to the D/A conversion circuits $1_0$, $1_1$, ..., $1_{11}$, respectively. One of latch circuits $6_0$, $6_1$, ..., $6_{11}$ is designated by a decoder 7. A 12-bit shift register 8 is used for supplying data to the latch circuits $6_0$, $6_1$, ..., $6_{11}$ and the decoder 7. That is, data is supplied from a serial data input terminal DI in synchronization with a clock signal at a clock terminal CLK to the shift register 8. When a series of two-bits are load in the shift register 8, a load complete signal is supplied from a terminal LD to the decoder 7, and the decoder 7 decodes four bit data $D_8$ to $D_{11}$ of the shift register 8 to select one latch circuit. As a result, 8 bit data $D_0$ to $D_7$ of the shift register 8 is written into the selected latch circuit.

Also, in FIG. 11, only two power supplies GND and $V_{CC}$ are used. Further, references $A_0$, $A_1$, ..., $A_{11}$ are output terminals for outputting semi-fixed register values in accordance with the data stored in the latch circuits $6_0$, $6_1$, ..., and $6_{11}$.

Figure 12:
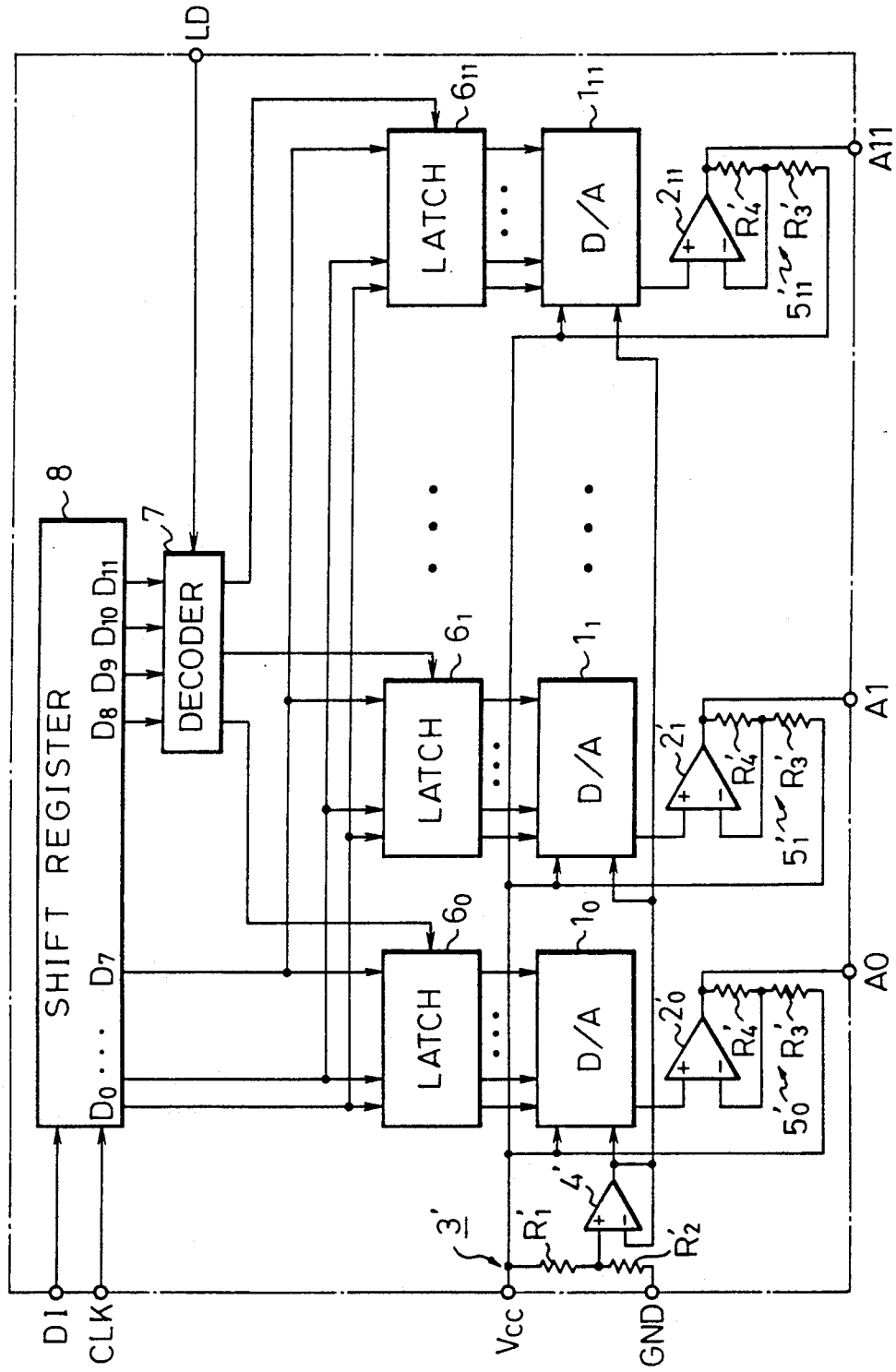
FIG. 12 is a block circuit diagram illustrating another semi-fixed resistor circuit to which the D/A converter of FIG. 12 is applied.

In FIG. 12, the D/A converter of FIGS. 9 and 10 is applied to a semi-fixed resistor circuit which has twelve 8-bit D/A converters. That is, in FIG. 12, twelve D/A conversion circuits $1_0$, $1_1$, ..., and $1_{11}$, which have the same configuration as the D/A conversion circuit 1 of FIG. 10, twelve amplifier circuits (operational amplifier) $2'_0$, $2'_1$, ..., $2'_{11}$, which have the same configuration as the amplifier circuit 2' of FIG. 10, and twelve enlarging circuits $5'_0$, $5'_1$, ..., $5'_{11}$, which have the same configuration as the voltage amplitude enlarging circuit 5' of FIGS. 9 and 10. Note only one voltage amplitude reducing circuit 3' and only one voltage follower 4' are provided.

Also, the latch circuits $6_0$, $6_1$, ..., and $6_{11}$, the decoder 7, and the shift register 8 are provided in the same way as shown in FIG. 11. Further, the operation of the circuit of FIG. 12 is the same as that of the circuit of FIG. 11.

I claim:

1. A digital/analog converter comprising:
a high power supply terminal means for generating a digital signal portion having a first maximum voltage;
a lower power supply terminal means for generating a digital signal portion having a first minimum voltage;
a conversion circuit for directly receiving the digital signal to thereby convert the digital signal and generate a converted analog signal having a voltage proportional to a digital value of the digital signal defined by the digital signal portions having the first minimum voltage and the first maximum voltage;
an amplifier circuit connected to said conversion circuit, for directly receiving, from the conversion circuit, the converted analog signal and for amplifying the analog voltage to obtain an amplified and converted output voltage having a linear characteristic between a second minimum voltage and a second maximum voltage;
a voltage amplitude reducing circuit, connected to said conversion circuit, for reducing a first amplitude of the digital signal defined by the digital signal portions having the first minimum voltage and the first maximum voltage inputted into said conversion circuit; and
a voltage amplitude enlarging circuit connected to said amplifier circuit, for directly receiving, from the amplifier circuit, the amplified and converted output voltage and for enlarging a second amplitude defined by the second minimum voltage and the second maximum voltage of the amplified and converted output voltage of said amplifier circuit to thereby conform the second amplitude to the first amplitude.

2. A converter as set forth in claim 1, further comprising a voltage follower connected between said voltage reducing circuit and said conversion circuit.

3. A converter as set forth in claim 1, wherein said amplifier circuit comprises an operational amplifier having a differential stage formed by depletion type MIS transistors.

4. A converter as set forth in claim 3, wherein said amplitude reducing circuit comprises a lowering circuit for causing the second maximum voltage to be lower than the digital signal portion having the first maximum voltage.

5. A converter as set forth in claim 4, wherein said lowering circuit comprises a voltage divider circuit formed by a series of two resistors between said high power supply terminal means and said low power supply terminal means.

6. A converter as set forth in claim 3, wherein said voltage amplitude enlarging circuit comprises a negative feedback circuit connected between an input and an output of said amplifier circuit, said negative feedback circuit being formed by a series of two resistors, the output of said amplifier circuit, and said lower power supply terminal means.

7. A converter as set forth in claim 1, wherein said amplifier circuit comprises an operational amplifier having a differential portion formed by enhancement type MIS transistors.

8. A converter as set forth in claim 7, wherein said amplitude reducing circuit comprises an increasing circuit for causing the digital signal portion having the first minimum voltage to higher than a threshold voltage of said enhancement-type MIS transistors.

9. A converter as set forth in claim 8, wherein said increasing circuit comprises a voltage divider circuit formed by a series of two resistors between said high power supply terminal means and said lower power supply terminal means.

10. A converter as set forth in claim 7, wherein said voltage amplitude enlarging circuit comprises a negative feedback circuit connected between an input and an output of said amplifier circuit, said negative feedback circuit being formed by a series of two resistors between said high power supply terminal means and the output of said amplifier circuit.

11. A converter as set forth in claim 1, wherein an enlarging ratio of said voltage amplitude enlarging circuit is not smaller than a reciprocal of an amplifying ratio of said voltage amplitude reducing circuit.

12. A converter as set forth in claim 1, wherein at least said voltage amplitude enlarging circuit is connected to an integrated circuit.

13. A digital/analog converter, comprising:
a high power supply terminal means;
a low power supply terminal means;
a conversion circuit for directly receiving a digital signal to thereby convert the digital signal and generate a converted analog signal having a voltage proportional to a digital value of the digital signal between a first minimum voltage and a first maximum voltage;
means for supplying said first maximum voltage and said first minimum voltage to said conversion circuit, said first maximum voltage and said first minimum voltage being between a first voltage of said high power supply terminal means and a second voltage of said low power supply terminal means, a difference between said first maximum voltage and said first minimum voltage being smaller than a difference between the first voltage of said high power supply terminal means and the second voltage of said low power supply terminal means, wherein the digital signal defined by the digital signal portions, having said first maximum voltage and said first minimum voltage, define a first amplitude; and
a voltage amplitude enlarging circuit, connected to said conversion circuit, for enlarging a second amplitude defined by a second minimum voltage and a second maximum voltage of a converted output voltage of said conversion circuit to thereby conform the second amplitude to the first amplitude.

* * * * *